United States Patent [19]

Temple

[11] Patent Number: 4,466,176
[45] Date of Patent: Aug. 21, 1984

[54] PROCESS FOR MANUFACTURING INSULATED-GATE SEMICONDUCTOR DEVICES WITH INTEGRAL SHORTS

[75] Inventor: Victor A. K. Temple, Clifton Park, N.Y.

[73] Assignee: General Electric Company, Schenectady, N.Y.

[21] Appl. No.: 502,834

[22] Filed: Jun. 9, 1983

Related U.S. Application Data

[63] Continuation-in-part of Ser. No. 406,734, Aug. 9, 1982, abandoned, which is a continuation of Ser. No. 396,179, Jul. 7, 1982, abandoned.

[51] Int. Cl.³ ............... H01L 21/223; H01L 21/265
[52] U.S. Cl. .................................. 29/571; 29/576 B; 29/578; 29/579; 29/580; 148/187
[58] Field of Search ............... 29/571, 576 B, 578, 29/579, 580; 148/1.5, 187, 190; 357/23 VD, 38

[56] References Cited

U.S. PATENT DOCUMENTS 3,595,716  7/1971  Kerr et al. ................... 29/576 B
4,084,986  4/1978  Aoki et al. .................. 148/1.5 X
4,148,054  4/1979  Hart et al. ................... 148/1.5 X
4,345,265  8/1982  Blanchard .................... 357/23 VD

OTHER PUBLICATIONS

Leipold et al., "A FET-Controlled Thyristor in SIPMOS Technology", Technical Digest of International Electron Devices Meeting, Washington, D.C., Dec. 8, 1980, Institute of Electrical and Electronics Engineers, Piscataway, N.J., pp. 79-82.

Primary Examiner—G. Ozaki
Attorney, Agent, or Firm—Charles E. Bruzga; James C. Davis, Jr.; Marvin Snyder

[57] ABSTRACT

Process for manufacturing insulated-gate semiconductor devices such as MOSFETs being with a semiconductor wafer (such as silicon) including a drain region, a gate insulating layer initially formed uniformly on the surface of the drain region, and a polysilicon conductive gate layer. A two-stage polysilicon etch procedure is disclosed. The initial etch produces relatively narrow channels with substantially vertical sidewalls. Unetched portions of the polysilicon layer are used as masks during a first P type diffusion to form a shorting extension of the device base region and during the forming of a silicon nitride mask layer by a highly directional process, such as ion implantation, which avoids the formation of any nitride layer on the channel sidewalls. In a subsequent lateral etch step, previously unetched portions of the polysilicon gate electrode layer are etched to define insulated polysilicon gate electrode structures. These structures extend upwardly from and are spaced along the principal surface, and are also spaced from the silicon nitride masks. Then, the silicon nitride masks are each used as a combination diffusion and selective oxidation mask to form MOSFET source and base regions and to oxidize the polysilicon gate electrode sidewalls. The silicon nitride mask is removed, and appropriate electrode metallization applied.

22 Claims, 17 Drawing Figures

ONE MASK METALLIZED GATE PROCESS
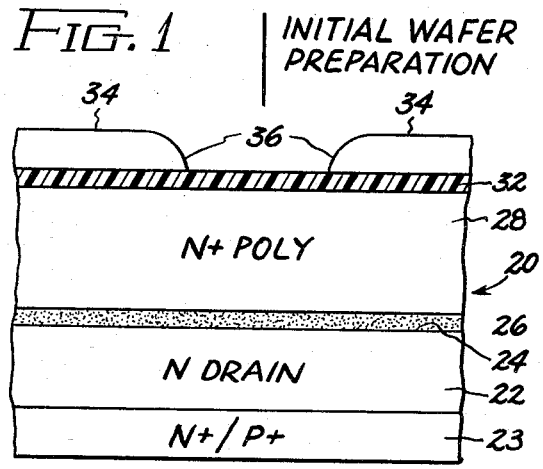
FIG. 1 — INITIAL WAFER PREPARATION
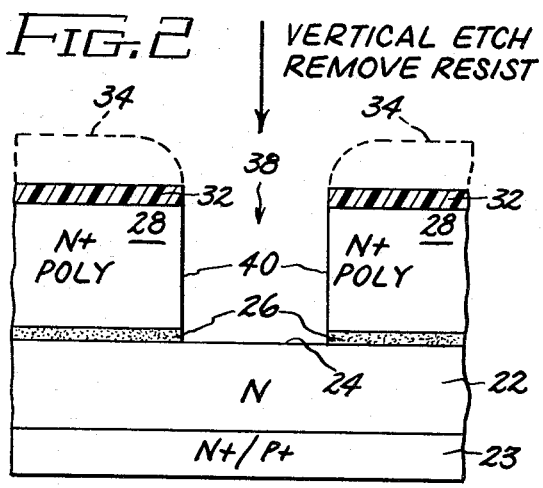
FIG. 2 — VERTICAL ETCH REMOVE RESIST
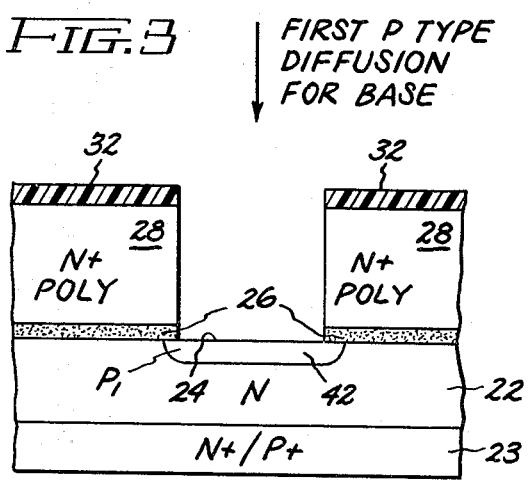
FIG. 3 — FIRST P TYPE DIFFUSION FOR BASE
THREE MASK REMOTE GATE CONTACT PROCESS
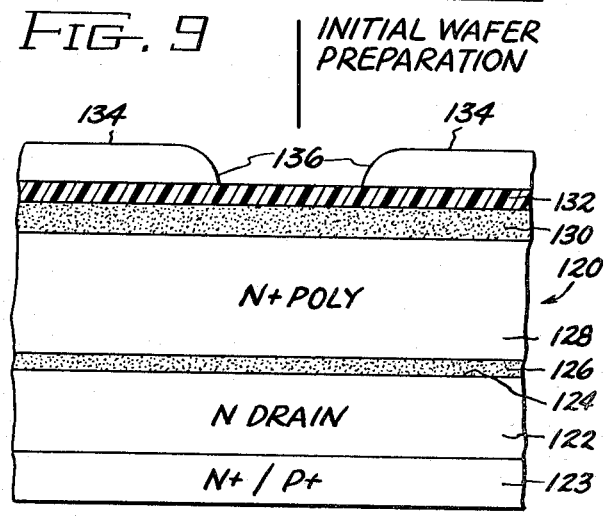
FIG. 9 — INITIAL WAFER PREPARATION
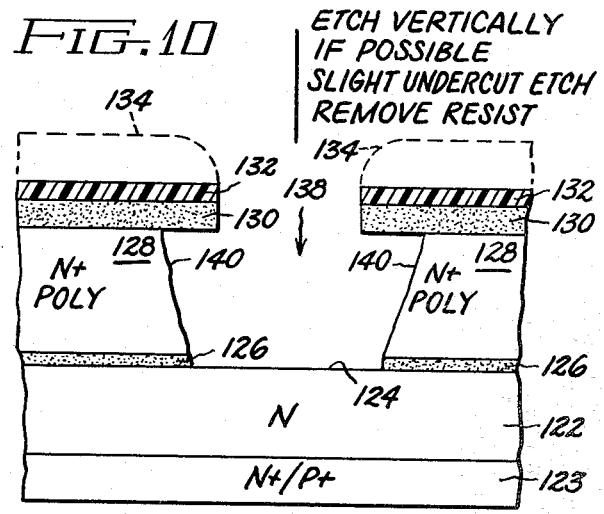
FIG. 10 — ETCH VERTICALLY IF POSSIBLE SLIGHT UNDERCUT ETCH REMOVE RESIST
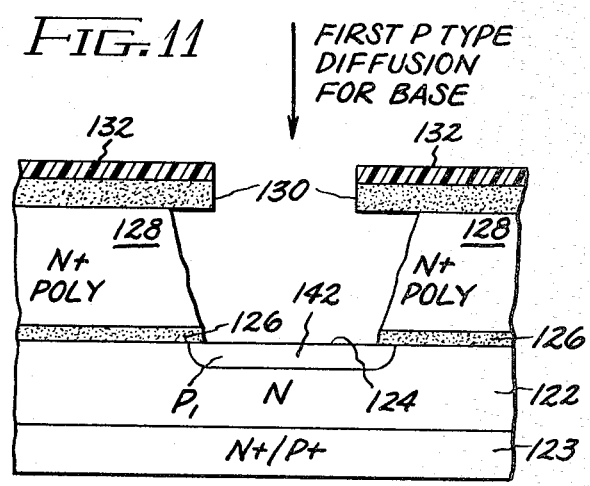
FIG. 11 — FIRST P TYPE DIFFUSION FOR BASE

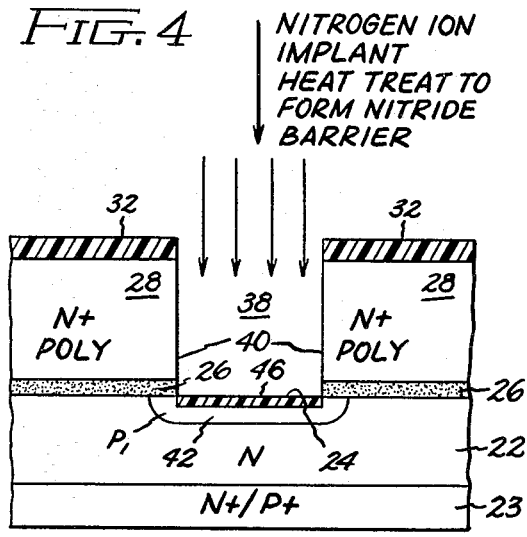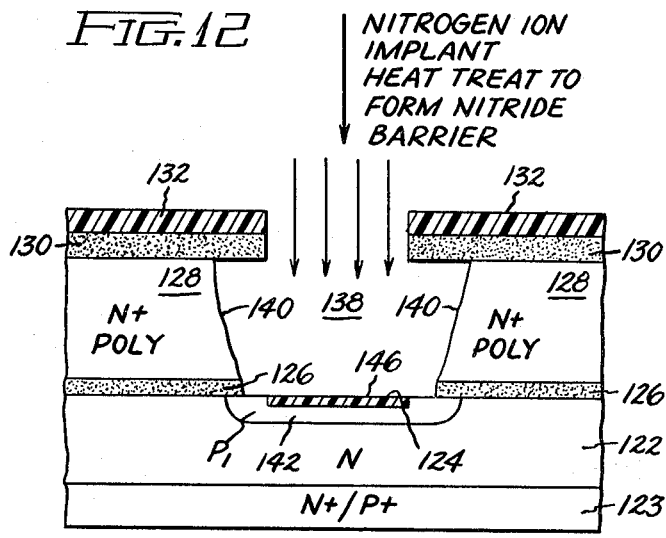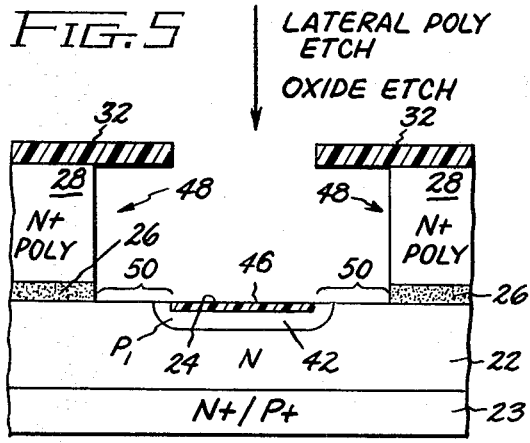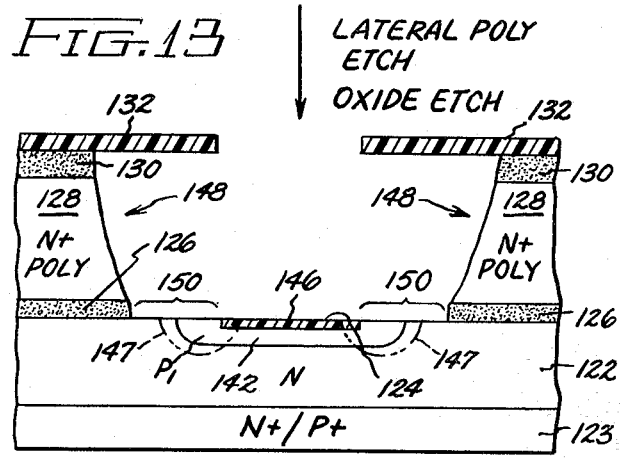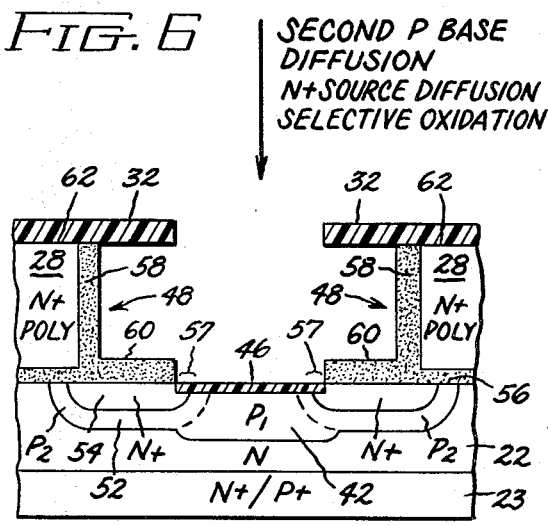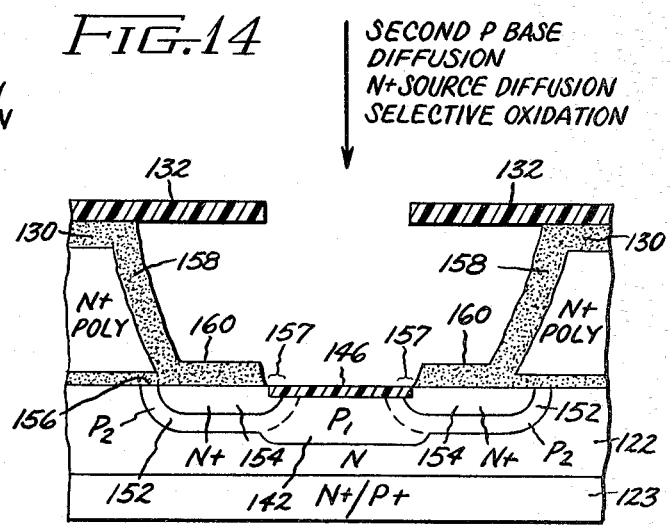

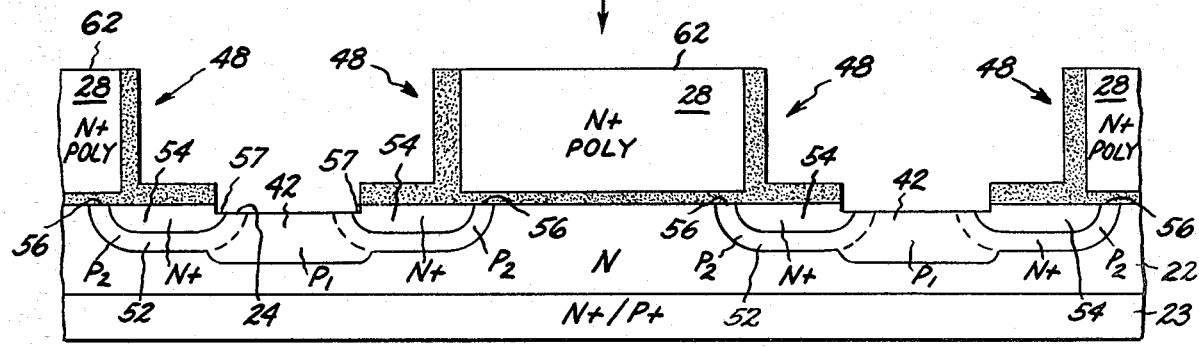
FIG. 7 — SELECTIVE ETCH OF NITRIDE
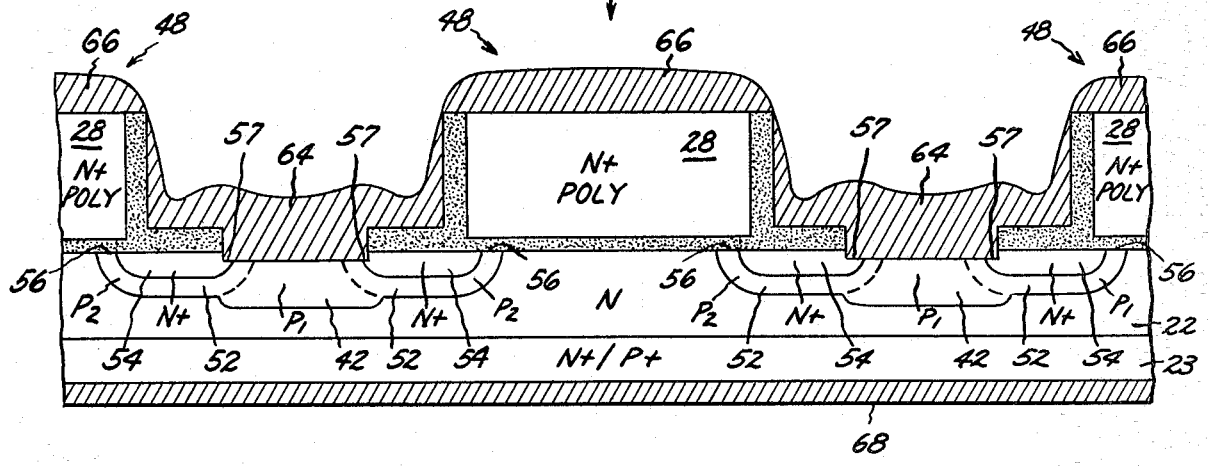
FIG. 8 — METALLIZE (AUTOMATIC SEPARATION)

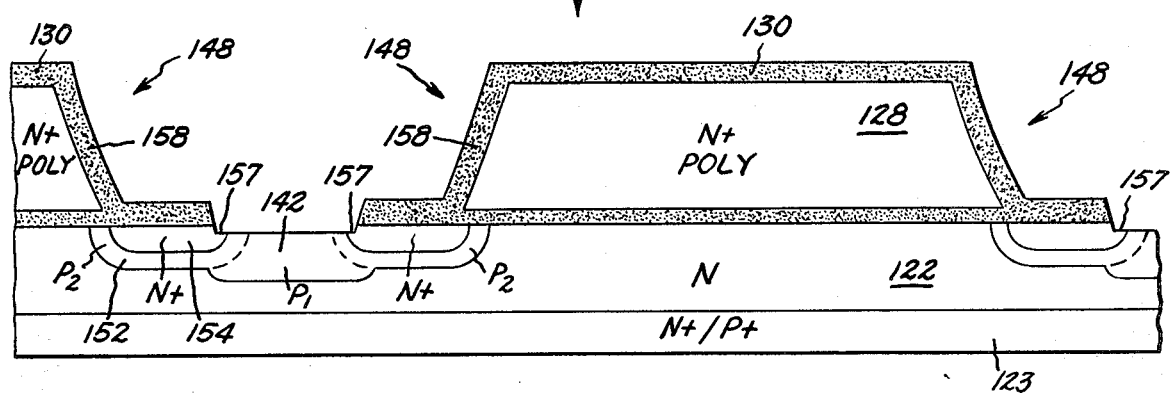
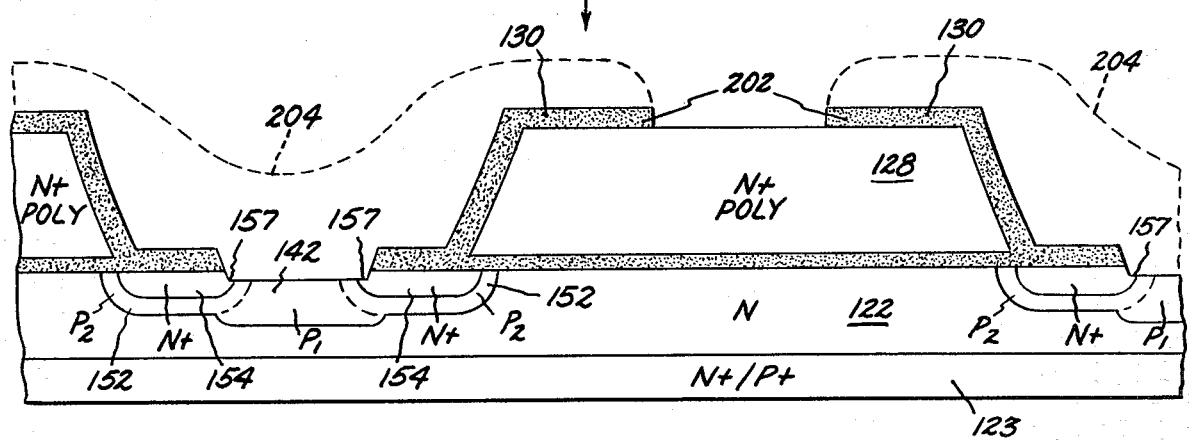
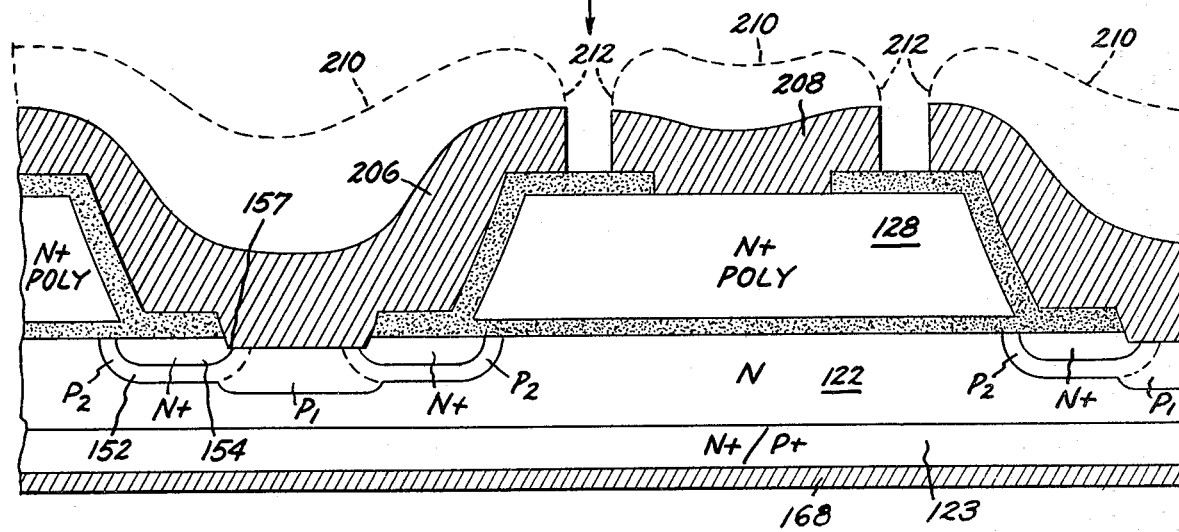

PROCESS FOR MANUFACTURING INSULATED-GATE SEMICONDUCTOR DEVICES WITH INTEGRAL SHORTS

The present application is a continuation-in-part of commonly-assigned application Ser. No. 406,734, filed on Aug. 9, 1982 and now abandoned, which is a continuation of commonly-assigned application Ser. No. 396,172, filed on July 7, 1982 and now abandoned.

CROSS-REFERENCE TO RELATED APPLICATIONS

The processes of the subject invention are in some respects alternatives to various processes disclosed in commonly-assigned application Ser. No. 406,731 filed on Aug. 9, 1982 by Victor A. K. Temple, and entitled "PROCESS FOR MANUFACTURING INSULATED-GATE SEMICONDUCTOR DEVICES WITH INTEGRAL SHORTS", now U.S. Pat. No. 4,417,385; and in commonly-assigned application Ser. No. 406,738, filed Aug. 9, 1982 by Victor A. K. Temple and entitled "MINIMAL MASK PROCESS FOR MANUFACTURING INSULATED-GATE SEMICONDUCTOR DEVICES WITH INTEGRAL SHORTS", now U.S. Pat. No. 4,430,792, which is a continuation of application Ser. No. 396,226, filed on July 8, 1982 and now abandoned; the entire disclosures of when are hereby expressly incorporated by reference herein.

BACKGROUND OF THE INVENTION

The present invention relates generally to processes for manufacturing insulated gate power semiconductor devices such as MOSFETs, as well as other more complex devices including MOSFET-like structures, such as Insulated Gate Rectifiers (IGRs), MOS-controlled thyristors and MOS-gated thyristors. The invention more particularly relates to processes for forming the upper electrode and base regions of such devices without any critically-aligned masking steps, thereby reducing the minimum cell size.

Known power MOSFETs generally comprise a multiplicity of individual unit cells (sometimes numbering in the thousands or tens of thousands) formed on a single silicon semiconductor wafer in the order of 300 mils (0.3 in.) square in size and electrically connected in parallel. Each cell is typically about twenty-five microns in width. A number of geometric arrangements for the unit cells are possible, including elongated strips.

One particular known process for manufacturing power MOSFETs is a double diffusion technique which begins with a common drain region of, for example, N conductivity type semiconductor material, in turn formed on an N+ conductivity type substrate. Within the drain region a base region is formed by means of a first diffusion to introduce impurities of one type, and then a source region is formed entirely within the base region by means of a second diffusion to introduce impurities of opposite type. If the drain region is N type, then the first diffusion is done with acceptor impurities to produce a P type base region, and the second diffusion is done with donor impurities to produce an N+ type source region. At the drain region surface, the base region exists as a band between said source and drain regions.

Conductive gate electrodes are formed on the surface over the base region band and separated by a gate insulating layer to define an insulated gate electrode structure. Typically, the gate electrodes are formed of highly-doped polysilicon. When voltage of proper polarity is applied to the gate electrodes during operation, an electric field extends through the gate insulating layer into the base region inducing a conductive channel just under the surface. Current flows horizontally between the source and drain region through the conductive channel.

To form the insulated gate electrode structure, during initial wafer preparation a uniform gate insulating oxide layer and then a uniform layer of highly-doped polysilicon are grown over the drain region, prior to any introduction of impurities to form the base and source regions. Channels are then etched through the polysilicon layer and the gate insulating oxide to define the polysilicon gate electrode structures spaced along the drain region.

In a power MOSFET structure, the source, base and drain regions correspond respectively to the emitter, base and collector of a parasitic bipolar transistor. As is known, if this parasitic bipolar transistor is allowed to turn on during operation of the power MOSFET, the blocking voltage and the dV/dt rating of the power MOSFET are substantially degraded. Accordingly, in order to prevent the turn on of the parasitic bipolar transistor during operation of the power MOSFET, the layers comprising the source and base regions are normally shorted together by means of an ohmic connection.

This same general MOSFET structure can be included in other, more complex devices. For example, rather than an N+ conductivity type substrate, a P+ conductivity type substrate may be employed, which becomes the anode region of an Insulated Gate or a MOS gated thyristor (MGT) depending on the density of shorts. The previous N conductivity-type drain region is formed as before, but is more generally termed herein a "first region", while the P+ conductivity type anode is herein termed a "second region". The P conductivity-type base region is formed as before in the first region, and the N+ conductivity-type region is formed in the base region. In the case of an IGR, this latter N+ conductivity type region is not termed a source region as before, but rather is a rectifier cathode region or, more generally, an upper electrode region.

As another example, a third device region, of N+ conductivity type, may be provided below a P (instead of P+) second region to form the lower main electrode region of an MOS-controlled thyristor.

In all of these cases, it will be appreciated that the MOS gate structure is essentially identical, and that the only substantial variations in the overall device structure are in the layers below the first region. In all cases, a short between the upper electrode region (whether is is termed a MOSFET source, an IGR cathode, or a MOS-gated thyristor main electrode region) and the base region is desired. In all cases, device metallization terminals are connected to the device upper electrode region and the gate electrodes.

For convenience, the invention is described herein primarily in the context of a MOSFET. However, it will be appreciated in view of the foregoing that the invention is equally applicable to various other insulated-gate semiconductor devices.

Known power MOSFET designs in manufacture typically require five to seven masking steps, some of which must be aligned to each other with high accuracy to produce working devices. In particular, to form the source-base short, between the first and second diffusion steps a diffusion barrier is applied by means of selective masking over a portion of the base diffusion surface area to prevent the subsequent source diffusion from entering the base diffusion in the selectively masked area. Thus a shorting extension of the base region extends to the surface. Thereafter, the selective mask is removed, and metallization is applied for the source electrode. A portion of the source metallization also makes ohmic contact with the previously masked area of the base region.

The large number of masking steps and need for alignment in the prior art processes decrease the process yield. Further, due to the need to provide tolerance for misalignment, unit cell size is larger than would otherwise be needed, undesirably increasing spreading resistance effects. Additionally, prior art process generally provide encased gate electrode structures having remote gate electrode contacts, thus increasing the gate input impedance.

In the above-incorporated commonly-assigned Temple application Ser. No. 406,731, various processes are disclosed for manufacturing power MOSFETs and similar devices. These processes are characterized by involving a minimal number of photolithographic masking steps and being fail-safe in a number of respects. In the processes disclosed in the above-identified Temple application Ser. No. 406,731, polysilicon gate MOSFETs are manufactured beginning with a semiconductor wafer including a drain region, a gate insulating layer initially formed uniformly on the surface of the drain region, and a polysilicon conductive gate layer. Through subsequent masking and etching steps, channels are etched through the polysilicon gate layer and then on through the gate insulating layer to the drain region. In general, the processes of Ser. No. 406,731 employ a single undercut etch step which leaves an overhanging layer over the polysilicon gate electrodes. The unetched portions define polysilicon gate electrode structures spaced along the drain region. Employing these polysilicon gate electrode structures as masks, impurities are introduced into the drain region through the surface between the gate electrodes, and then driven by thermal diffusion to form appropriately located base and source regions. The source region is located both laterally and vertically within the base region. In accordance with various specific processes therein disclosed, these base and source impurities are introduced either by ion implantation, or from a gas source, or a combination of the two. In the case of ion implantation, the impurities in some process variations are introduced through the gate insulating layer. A number of process alternatives are disclosed for forming a shorting extension of the base region up through and to a portion of the surface of the source region. Many of these process alternatives employ the overhang left by the undercut etch to form such shorting extension in the source region surface portion and therefore are self-masked. Two general MOSFET structures are formed in accordance with the processes disclosed in application Ser. No. 406,731. One structure has metallized gate terminal fingers, and is formed employing one-mask processes. The other structure has gate fingers encased in insulating oxide and connected to remote gate contacts, and is formed employing the three-mask processes. The preferred processes for both structures require selective oxidation of the polysilicon gate electrode material, and various approaches to this selective oxidation are described.

In the other above-incorporated patent application, Temple application Ser. No. 406,738, various process alternatives are disclosed, characterized generally by employing a two-step etch process to form the source-to-base short, without any requirement for an undercut etch leaving an overhang for self-masking. (However, for automatic separation of source and gate metallization, an overhanging layer of a conductive refractory material is beneficial.)

In brief, the process alternative of Ser. No. 406,738 employs the following sequence for forming the source-to-base short: (1) Following initial wafer preparation, a narrow etch at least to the gate insulator layer to form a narrow channel. (2) Form a defined short region employing the sides of the narrow channel as masks. (3) A lateral etch to widen channel. (4) Form source and base regions.

The present invention provides an alternative two-step etch process for forming the source-to-base short. In general, the present invention provides a self-aligned techniques wherein a mask formed between the first and second etch steps serves as a combined selective oxidation and diffusion mask.

SUMMARY OF THE INVENTION

Accordingly, it is an object of the invention to provide a self-aligned process for manufacturing insulated-gate semiconductor devices, and, particularly, in the exemplary case of a MOSFET, for forming the source and base regions and the ohmic short between the source and base regions.

It is another object of the invention to provide such processes which are suitable for devices having either directly metallized gate contact fingers or remote gate electrode contacts.

Briefly, and in accordance with one aspect of the invention, a self-aligned process for manufacturing an insulated-gate semiconductor device begins with providing a semiconductor wafer such as silicon including a first device region such as a MOSFET drain region of one conductivity type, for example N type, having a principal surface. This wafer is initially prepared by successively forming a gate insulating region layer, for example of silicon dioxide, and a conductive gate electrode layer, such as highly-doped polysilicon, for example of N+ conductivity type. If a MOSFET structure having metallized gate terminal fingers is being manufactured, preferably an upper mask layer, for example of silicon nitride, is formed over the polysilicon gate electrode layer. If the power MOSFET being formed is of the type having gate fingers encased in insulating oxide and connected to remote gate contacts, a silicon dioxide upper layer and silicon nitride upper layer are successively formed over the polysilicon conductive gate electrode layer.

Next, an etch resist mask is formed generally on the wafer, the etch resist mask having openings generally defining the ultimate locations of source regions. One specific process embodiment for forming a power MOSFET with metallized gate terminal fingers is a one-mask process, and the etch resist mask is the only mask employed in the process. One specific process embodiment for forming encased-gate electrode MOSFET structures is a three-mask process and, accordingly, this etch resist mask is the first mask employed in the process. In either process embodiment, the etch resist mask is applied over the upper mask layer of silicon nitride.

A two-stage polysilicon etch procedure is employed. The first etch stage occurs next. By means of an appropriate etching process, the polysilicon conductive gate electrode layer and then the gate insulating layer, together with any upper nitride or oxide layers, are etched through to the drain region principal surface to form relatively narrow channels. The etch resist mask is then removed.

Impurities appropriate to form shorting regions of opposite conductivity type, for example of P conductivity type, are then introduced into the drain region, for example by gas source diffusion. During this step, unetched portions of the polysilicon gate electrode layer and of the gate insulating layer serve as masks. At some point in the process, either immediately or in combination with a later diffusion or heating step, the shorting region impurities are diffused or driven, for example thermally, at least vertically to a predetermined depth such that the shorting region extends from the principal surface to the predetermined depth. Any oxide formed in this step is etched away.

Next, masks are formed at the shorting region surfaces. Preferably, these masks are of silicon nitride. During this step, unetched portions of the polysilicon gate electrode layer, the gate insulating layer, and any upper layers serve as masks. The silicon nitride masks are formed by any process which avoids the deposition of nitride on the groove sidewalls. Preferably, the silicon nitride masks are formed by ion implantation of nitrogen, followed by heat treatment to form silicon nitride. Other directional processes may be employed, such as directional low pressure vapor deposition or sputtering from a bombarded silicon nitride source.

The previously un-etched portions of the polysilicon gate electrode layer and of the gate insulating layer are then sequentially laterally etched in a two-stage second etch stage to define insulated polysilicon gate electrode structures extending upwardly from and spaced along the principal surface. These insulating polysilicon gate electrode structures are spaced from the silicon nitride masks at the shorting region surfaces such that silicon is exposed at least between the silicon nitride masks and the gate electrode structures.

At this point, the silicon nitride mask thus formed is utilized as a combination diffusion and selective oxidation mask during diffusion processes to form the MOSFET source and base regions and a selective oxidation process to oxidize at least the polysilicon gate electrode sidewalls. These diffusion and selective oxidation processes may proceed either sequentially or generally simultaneously.

In particular, introduced into the drain region are impurities appropriate to form base regions of opposite conductivity type, for example P type, and impurities appropriate to form source regions of the one conductivity type, for example N+ conductivity type, within the base regions. The impurities introduced are thermally diffused to appropriately locate and configure the base and source regions such that at the principal surface the base regions exist as bands of opposite conductivity type between source regions and the common drain region, with active portions of the base region bands underlying at least portions of the insulated polysilicon gate electrode structures. In order to allow a source-to-base short to be completed in a subsequent source metallization step, portions of the source regions extend laterally under the silicon nitride masks at the shorting region surfaces, and the base regions and corresponding shorting regions form continuous regions of the opposite conductivity type below the principal surface.

The selective oxidation step comprises heating, in the presence of oxygen, to oxidize the gate electrode sidewalls and source region surface portions not masked by the silicon nitride mask at the shorting region surface.

Next, the silicon nitride mask is removed by selectively etching, and any other silicon nitride layers are removed.

The remaining steps in the fabrication process are metallization steps. In the case of the one-mask process for forming MOSFET structures with metallized gate terminal fingers, metal, for example aluminum, is deposited, such as by evaporation, onto the wafer surface, and automatically separates into upper gate contact regions and lower source contact regions. In the case of the three-mask process for forming encased gate electrode fingers, an additional masking and etching step is employed to etch gate contact windows on a portion of the wafer other than the location of source regions, and a third masking step is employed to pattern the metallization into separate source and gate electrode regions.

One of the advantages of the present invention is the fail-safe nature of many of the processes described. While an individual unit cell may not be perfectly formed, the entire device will not be failed. Higher process yields thus result. One such example is a photoresist error in the initial mask, such as resist being present where is should be, or not being present where it should be. In such an event, a unit cell may be inoperative, but the device as a whole will be operable. Another example is a failure to provide a source-to-base short in some area of the device.

The potentially fatal failure modes are relatively few. One example is a metallization error, where the source and gate metallizations connect, shorting the device.

BRIEF DESCRIPTION OF THE DRAWINGS

While the novel features of the invention are set forth with particularity in the appended claims, the invention, both as to organization and content, will be better understood and appreciated and features thereof, from the following detailed description, taken in conjunction with the drawings, in which:

FIG. 1 is a cross-sectional view depicting initial wafer preparation steps in a representative one-mask process in accordance with the invention, the FIG. 1 section being taken on a wafer portion which will ultimately comprise the active portion of a single unit cell of a power MOSFET device;

FIG. 2 depicts a step of initial vertical etching;

FIG. 3 depicts a step of introducing shorting region impurities by means of a first P type diffusion;

FIG. 4 depicts the forming of a silicon nitride mask, for example, by ion implantation;

FIG. 5 depicts a subsequent lateral etching step;

FIG. 6 depicts base diffusion, source diffusion and selective oxidation steps;

FIG. 7 depicts a selective etching step to remove the nitride mask;

FIG. 8 depicts the metallization step and cross-sectional configuration of a completed device having metallized gate terminal fingers;

FIGS. 9–15 correspond generally with FIGS. 1–7, and illustrate corresponding steps of a representative three-mask process for forming a MOSFET structure having encased gate contact fingers connected to remote gate contacts;

FIG. 16 depicts a step of etching to open remote gate contact windows; and

FIG. 17 depicts steps of metallization and patterning to form separate source and gate metallization.

DETAILED DESCRIPTION OF THE PREFERRED EMBODIMENTS

Preliminarily, it should be noted that for convenience the insulated-gate semiconductor devices and fabrication processes of the invention are described herein primarily in the context of an exemplary MOSFET having N+ conductivity type source, P conductivity type semiconductor base or channel regions, and an N conductivity type semiconductor common drain region. It will be appreciated, however, that the invention is equally applicable to insulated-gate devices wherein the active regions formed are of opposite conductivity type. Moreover, the processes of the invention are applicable to various insulated-gate devices other than MOSFETs, as described in detail hereinbelow.

Two general forms of MOSFET device are described herein, although the concepts of the invention are not limited to either form. The first general form of MOSFET device and manufacturing processes are described hereinbelow with reference to FIGS. 1–8. This first form of MOSFET device is characterized by having metallized gate terminal fingers for low gate input resistance to permit high frequency operation, and is fabricated employing a one-mask process as described herein.

The second general form of MOSFET device and manufacturing processes are described hereinbelow with reference to FIGS. 9–17. This second general form of MOSFET device is characterized by having gate electrodes encased in insulating oxide, in turn surrounded by source metallization, and remote gate contacts are employed. The second form of device is fabricated employing a three-mask process.

In either event, there are a variety of specific conductive gate electrodes structures possible, for example gate electrode structures employing other conductive layers such as is disclosed in the two above-incorporated Temple application Ser. Nos. 406,731 and 406,738, and there is accordingly no intention to limit the present invention to devices having gate electrode structures comprising simply a polysilicon layer.

It should further be noted that the processes as described in detail below are the specific forms which are presently preferred. It will be appreciated, however, that the processes and process variations may be employed in combinations other than those specifically described hereinbelow and, further, that the various process steps may be done in a number of orders different than those which are specifically described herein.

ONE-MASK PROCESS FOR FORMING METALLIZED GATE DEVICES

Referring now to FIG. 1, a representative one-mask process in accordance with the invention for fabricating a power MOSFET having metallized gate terminal fingers begins with the step of providing a semiconductor wafer 20 including a drain region 22 on N conductivity type, which may be grown on a suitable resistivity N+ conductivity type wafer substrate 23. The drain region 22 may, for example, be epitaxially grown, and is, for example, two mils thick with a twenty-five ohm-centimeter resistivity, for a typical 500 volt structure. While silicon is the preferred semiconductor material, there are other possibilities, such as gallium arsenide.

The drain region 22 has a principal surface 24, and a gate insulating layer 26, comprising for example silicon dioxide, is formed on the principal surface 24.

Next, a conductive gate electrode layer 28 of appropriate thickness for the ultimate gate electrodes is formed over the gate insulating layer 26. Preferably the gate electrode layer 28 comprises polysilicon highly-doped with either N+ or P+ conductivity type impurities, N+ conductivity type being illustrated. There are other materials, however, which may be employed for the conductive gate electrode layer 28, such as a metal silicide. Whatever material is employed, its general requirements are that it (1) be controllably oxidizable, (2) be etchable by a process or etchant which does not etch oxide, (3) have good conductivity, and (4) have a reasonable thermal expansion match to silicon.

Over the gate electrode layer 28 is formed an upper mask layer 32 comprising, for example, silicon nitride.

To facilitate a subsequent initial etching step, an etch resist mask 34 is formed on the silicon nitride layer 32. The etch resist mask 34 is photolithographically patterned to provide openings 36 generally defining the ultimate locations and configurations of recessed source and base regions in the completed power MOSFET structure. While a variety of geometric structures are possible, preferably the source and base regions to be formed below the mask 34 openings 36 are elongated channels connected at one end to form a recessed comb-like structure, and the openings 36 are arranged in a corresponding pattern.

With reference now to FIG. 2, this initial etching step is depicted, which comprises etching substantially vertically through the nitride layer 32, the polysilicon gate electrode layer 28, and the gate oxide layer 26 to the principal surface 24 of the drain region 22 to define a substantially vertically-walled relatively narrow channel 38. It is important for the initial etching step depicted in FIG. 2 to be a directional such that the channel 38 has the substantially vertical sidewalls 40 depicted in order to facilitate subsequent metallization with automatic separation of the metallization into gate and source regions, described hereinafter with reference to FIG. 8. For etching substantially vertically through polysilicon, a number of known processes may be employed, generally known as dry etching processes, which involve electric fields to establish directionality. One particular dry etching process suitable for use in the practice of the present invention is reactive ion etching.

The final step in the vertical etching process depicted in FIG. 2 is removal of the mask 34. However, in the event the material of the mask 34 is such that the mask 34 will not survive high temperature processing, no specific mask removal step need be employed. In such event, subsequent thermal diffusion and thermal oxidation steps will serve to remove the mask 34.

Next, as depicted in FIG. 3, a first P type diffusion is done, for example by introducing and thermally diffusing impurities from a gas source, to form a shorting region 42 which, in the completed device structure described hereinafter with reference to FIG. 8, will comprise a continuation or an extension of the P conductivity type base region. The shorting region 42 is designated $P_1$ to indicate it is the first P type diffusion.

Preferably, the first P type diffusion depicted in FIG. 3 is done in the absence of oxygen so as to grow little or no surface oxide. However, if some surface oxide is grown, it is selectively etched away in a light etching step. Although P type impurities are also introduced into the sidewalls 40 of the polysilicon gate electrode layer 28 during the diffusion step of FIG. 3, this presents no particular problem for two reasons: First, the polysilicon gate electrode layer 28 has a relatively higher impurity concentration, and thus retains its conductivity type even though some P type impurities are introduced; Second, in any event the polysilicon gate electrode layer 28 is laterally etched back in a subsequent etching step, as described hereinafter with reference to FIG. 5, thus entirely removing any portion of the layer 28 having P type impurities introduced.

These shorting region impurities may then be driven to a predetermined depth as shown in the completed device of FIG. 8. In many cases it is possible to avoid this drive because subsequent high temperature processing steps accomplish the same purpose.

Next, with reference to FIG. 4, a mask 46 is formed at the shorting region 42 surface 24. During the formation of the mask 46, unetched portions of the polysilicon gate electrode layer 28 and the gate insulating layer 26 serve as masks.

Preferably, the mask 46 in FIG. 4 comprises silicon nitride and is formed by implantation of nitrogen ions in a generally vertical direction, and a subsequent short heat treatment after the ion implantion to form silicon nitride ($Si_3N_4$). Known ion implant processes may be employed, such as those described in J. F. Gibbons, "Ion Implantation in Semiconductors—Part I: Range Distribution Theory and Experiments", *Proc. IEEE*, Vol. 56, No. 3, pp. 295-319 (March 1968); and J. F. Gibbons, "Ion Implantation in Semiconductors—Part II: Damage Production and Annealing", *Proc. IEEE*, Vol. 60, No. 9, pp. 1062-1096 (September 1972).

Other materials for the mask 46 can also be employed, for example, various refractory metal nitrides formed by co-sputtering or co-evaporation.

In FIG. 4, the nitrogen ion implantation is done at relatively low energy, so as to implant nitrogen ions to a relatively slight depth below the surface, for example, to a depth of less than approximately 100 to 200 Angstroms. The nitrogen ion dose is preferably in the order of $10^{17}$ atoms per $cm^2$, or higher, so that in the implanted zone the concentration is sufficient to form $Si_3N_4$.

In accordance with the invention, the silicon nitride mask layer 46 may be formed by processes other than ion implantation, so long as it is possible to avoid formation of a silicon nitride layer on the channel 38 sidewalls 40. Such a layer would interfere with the subsequent selective etching step, described hereinafter with reference to FIG. 5, wherein the polysilicon layer 28 is laterally etched back. Two other directional processes in particular which are suitable are directional low pressure vapor deposition and directional sputtering of silicon nitride.

Next, as depicted in FIG. 5, previously unetched portions of the polysilicon gate electrode layer 28 and of the gate insulating region layer 26 are laterally etched back in sequence to define insulated polysilicon gate electrode structures 48 comprising polysilicon conductive gate electrode portions 28 spaced and insulated from the drain region 22 principal surface 24 by remaining portions of the gate insulating layer 26. The gate electrode structures 48 thus extend upwardly from and are spaced along the principal surface 24, and additionally are spaced as at 50 from the silicon nitride masks 46 at the shorting region 42 surface 24. The FIG. 5 etching steps for etching layers 28 and 26 are done, first, with any silicon etching solution which does not etch silicon nitride, such as hydrofluoric acid and $HNO_3$ buffered with $H_2O_2$, and, secondly, with any silicon dioxide etching solution which does not etch silicon nitride, such as hydrofluoric acid buffered with ammonium flouride.

Next, the silicon nitride mask 46 is employed as a combined diffusion and selective oxidation mask to form the structure depicted in FIG. 6. In particular, impurities are introduced, such as by diffusion, into the drain region 22 between the gate electrode structures 48. The impurities introduced are appropriate to form base regions 52 of P conductivity type and to form source regions 54 of N+ conductivity type within the base regions 52. The diffusion to form the P conductivity type base regions 52 thus comprises a second P type diffusion, and the resultant region is accordingly designated $P_2$. From FIG. 6, it will be seen that the P conductivity base regions 52 formed by the second P type diffusion, $P_2$, and the shorting regions 42 formed by the first P type diffusion, $P_1$, form a continuous region of P conductivity type semiconductor material below the principal surface 24.

The impurities thus introduced are thermally diffused to appropriately locate and configure the base 52 and source 54 regions such that, at the principal surface 24, the base regions 52 exist as bands 56 of opposite conductivity type between the source regions 54 and the common drain region 22, with active portions of the base region bands 56 underlying at least portions of the insulated polysilicon gate electrode structures 48. In order to avoid oxidation and thus to permit source metallization described hereinafter with reference to FIG. 8, it is necessary that portions of the source regions 54 extend laterally under the silicon nitride masks 36, as at 57.

Also depicted in FIG. 6 is selective oxidation to form or grow oxide on all exposed silicon surfaces, namely oxide 58 on the polysilicon gate electrode sidewalls, and oxide 60 on the source region 54 surfaces not masked by the nitride mask 46. The oxide layers 58 and 60 are formed by heating in the presence of oxygen and may be done at the same time as the final drive to form the base 52 and source regions 54.

It will be appreciated by those skilled in the art that the diffusions to form the P conductivity type base regions 52 and the N+ conductivity type source regions 54 may be done sequentially in either order, or simultaneously, with the ultimate shape of the diffused regions being a function of the rates of diffusion and other characteristics of the particular impurities introduced.

In FIG. 6, the polysilicon gate electrode tops 62 are not oxidized, being protected by the remaining portions of the silicon nitride mask 32.

Further information concerning selective oxidation techniques may be found by reference to an article by J. Hui, T. Y. Chiu, S. Wong, and W. G. Oldham, "Selective Oxidation Technologies for High Density MOS", *IEEE Electron Device Letters*, Vol. EDL-2, No. 10, pp. 244-247 (October 1981).

Next, as depicted in FIG. 7, the silicon nitride upper layer 32 (FIGS. 1-6) and the silicon nitride mask 46 (FIGS. 4-6) are removed, such as by selective etching employing, for example, hot phosphoric acid. Thus, bare silicon or other conductive material is exposed at the polysilicon gate electrode 48 tops 62, and bare silicon is exposed at the principal surface 24 on the shorting regions 42 and on the source region 52 portions 57 which extended laterally under the silicon nitride mask 46 during the diffusion step of FIG. 6. For clarity, the cross-sectional view of FIG. 7 is expanded to include two complete unit cell structures, illustrating the repeating comb-like interdigitated source and gate regions of the MOSFET device.

Finally, with reference to FIG. 8, the completed device structure is reached by evaporating metal, such as aluminum, onto the wafer so as to form metallized recessed source electrode terminals 64 in ohmic contact with the portions 57 of the source regions 54 and in ohmic contact with the shorting extension 42 of the base regions 52. Additionally, metallized gate layer terminals 66 are formed in ohmic contact with the polysilicon gate electrode structure 48.

The metallization is automatically separated into the high regions 66 over the gate terminals, and the lower regions 64 over the source 54 and shorting regions 42. During the metallization, partial covering of the polysilicon gate sidewalls is not harmful due to the insulating oxide layer 58 although, to avoid source-to-gate shorts, continuous metallized paths must not be formed on the gate sidewall oxide 58. If this occurs a partial metal etch step is required to remove a portion of the sidewall metallization.

Also depicted in FIG. 8 is drain metallization 68 applied at any appropriate point in the process in ohmic contact with the drain region 22.

Although not specifically illustrated, in plan view the completed device of FIG. 8 preferably comprises a recessed comb-like structure comprising the source metallization 64, with individual source metallization fingers each connected at one of their ends to a common recessed source contact pad. A raised comb-like structure comprising gate metallization 66 is interdigitated with the recessed source metallization comb-like structure, with individual gate metallization fingers each connected at one of their ends to a common gate electrode facing the opposite direction with respect to the recessed source electrode.

At this point it should be noted that the structure of FIGS. 7 and 8, while serving to illustrate the concepts of the present invention which is concerned with methods for forming source-to-base shorts, is not the best possible from the standpoint of automatic separation of source metallization 64 and gate metallization 66. Rather, as disclosed in the above-incorporated Temple application Ser. No. 406,731 a conductive overhang layer can be employed over the polysilicon 28.

Specifically, rather than forming the layer 32 of silicon nitride (FIGS. 1–6), the layer 32 can be formed of a refractory metal silicide, for example, with a protective silicon nitride layer on top. The refractory metal silicide is conductive. In the modification, the layer 32 would still be undercut as depicted in FIGS. 5 and 6. However, only the protective silicon nitride layer and not the refractory metal silicide layer would be removed in the FIG. 7 etch step, leaving an overhang.

The overhang of refractory metal silicide then assures automatic metal separation without need for a partial metal etch or for vertical polysilicon gate sidewalls.

In the present disclosure, again, the overhanging refractory metal silicide layer is not shown because the overhanging layer is not needed to form source-to-base shorts.

In the operation of the completed device of FIG. 8, each unit cell is normally non-conducting with a relatively high withstand voltage. When a positive voltage is applied to the gate electrode 48 via the gate terminal metallization 66, an electric field is created and extends through the gate insulating layer 26, inducing a thin N type conductivity channel in the base region 52 just under the surface 56 below the insulated gate electrode structure 48. As is known, the more positive the gate voltage, the thicker this conductive channel becomes, and the more working current flows. Current flows horizontally near the surface 56 between the source 54 and drain 22 regions, and then vertically through the remaining drain region 22 to the metallized drain terminal 68.

OTHER INSULATED-GATE DEVICES

As summarized hereinabove, the general MOSFET structure depicted in FIG. 8 is representative of insulated-gate semiconductor devices in general, to which the processes of the invention are equally applicable.

For example, to provide an Insulated Gate Rectifier (IGR), the substrate 23 would be of P+ conductivity type, as indicated alternatively in FIG. 1, and would comprise the rectifier anode region. The N— conductivity-type region 22 is then more generally herein termed a first region, and the substrate 23 is herein more generally termed a second region. The source region 54 comprises the rectifier cathode, and is herein more generally termed an upper terminal region.

Similarly, although not specifically illustrated, an MOS-gated thyristor may be formed by provided by forming a third region, of N+ conductivity type, below the second region 23. The third region would then comprise a thyristor main terminal.

As will be appreciated, usual device manufacturing processes generally begin with the lower region layer, i.e., the third region in the case of a MOS-gated thyristor, and the upper layers are then successively formed such as by epitaxial growth techniques.

Accordingly, it will be appreciated that the processes of the invention are described herein in the context of a MOSFET, for convenience only, and that the processes of the invention apply equally well to other forms of insulated-gate semiconductor devices in general.

THREE-MASK PROCESS FOR FORMING ENCASED-GATE DEVICES

With reference now to FIGS. 9–17, there are depicted steps in a corresponding representative three-mask process for forming an encased-gate electrode MOSFET device, culminating in the device structure depicted in FIG. 17.

The process steps correspond in nearly all respects and, for convenience, elements in FIGS. 9–17 corresponding to elements in FIGS. 1–8 are designated by reference numerals formed by adding 100 to the reference numeral for the corresponding element of FIGS. 1–8.

Referring to FIG. 9, initial wafer preparation is substantially as before, with the exception that, preferably, successively formed on the polysilicon gate electrode layer 128 is an upper oxide layer 130, and then the nitride layer 132. Un-etched portions of the upper oxide layer 130 remain in the completed device to comprise a portion of the encasing insulating oxide for the gate electrode structures 148. It is possible, however, to form an encased gate electrode structure without initially providing the upper oxide layer 130 and the upper nitride layer 132, provided the polysilicon gate electrode layer 128 is sufficiently doped to be electrically unaltered by the subsequent diffusion steps.

Also, as in the embodiment of FIGS. 1–8, the layer 132 can be a conductive material, such as a refractory metal silicide which remains in the completed device structure for lower gate input resistance. The layer 132 of such a conductive material provides a lower-conductivity path to the remote gate contact pads.

FIG. 10 depicts a vertical etch step corresponding generally with the vertical etch step of FIG. 2, although it is not as important that the sidewalls 140 be vertical, as in the case of FIG. 2, because automatic separation of metallization into the upper gate metallization 66 (FIG. 8) and lower source metallization 64 (FIG. 8) is not utilized in the encased gate electrode process. Rather, as described hereinafter with reference to FIGS. 16 and 17, the metallization is patterned by means of a mask and etching step. In the vertical etch step of FIG. 10, it is also preferable to slightly etch back the polysilicon gate electrode layer 128 to undercut the oxide 130 and nitride layers 132. The slight undercut of FIG. 10, however, is distinct from the subsequent lateral etching step described hereinafter with reference to FIG. 13, which corresponds to lateral etching step of FIG. 5.

Next, FIG. 11 depicts the first P type diffusion, corresponding with that depicted in FIG. 3, described hereinabove.

Next, FIG. 12 illustrates the step of forming the nitride barrier 146, in a manner generally corresponding to that of FIG. 4. In the implantation process depicted in FIG. 12, overhangs of the upper layers 132 and 130, particularly the overhang of the oxide layer 130, serve as a mask or barrier during the ion implantation process.

Next, FIG. 13 depicts a two-stage lateral etching step generally corresponding to that of FIG. 5, although it is not necessary to preserve a vertical gate sidewall profile. In the first stage etch of the conductive gate electrode layer 128, a preferred etchant comprises any silicon etch that etches the highly-doped N-type layer 128 at a much higher rate than the highly-doped P-type region 142 or the lightly-doped N type region 122. Such a preferred etchant comprises, for example, a mixture of 8 parts CH$_3$COOH, 3 parts HNO$_3$ and 1 part HF, at least where the resistivities of N layer 128, P region 142 and N region 122 are, respectively, less than 0.01Ω-cm, greater than 0.068Ω-cm and greater than 0.068Ω-cm. If such a preferred etchant is not used, then silicon regions 142 and 122 will be etched to a depth as indicated by phantom lines 147. This change in contour of the regions 142 and 122 does not, however, alter the further device processing steps discussed below.

The diffusion and selective oxidation steps of FIG. 14 correspond with those of FIG. 6, and the description hereinabove applies equally as well.

Next, as depicted in FIG. 15, the nitride layers are all selectively etched. While FIG. 15 generally corresponds with FIG. 7, FIG. 15 differs in that remaining portion 130 of the upper oxide layer covers the polysilicon gate electrode structures 148, cooperating with the gate sidewall oxide 158 to completely encase the polysilicon gate electrodes. Thus, remote gate contacts are required.

Accordingly, as depicted in FIG. 16, to open a gate contact window 202 through the oxide 130 remote from the source 154 and base 152 regions, a second photoresist mask 204 is employed, shown in dash lines. Using the mask 204, the oxide layer 130 is chemically etched away to form the opening 202 for the gate contact window. The second mask 204 is then removed, and the wafer cleaned.

Finally, as depicted in FIG. 17, electrode metal, preferably aluminum, is coated, preferably by evaporation, onto the device and patterned as at 206 and 208 to form source and gate electrodes. This patterning requires a third mask, depicted in dash lines at 210, having openings 212. A common drain electrode 168 is metallized onto the drain region 122 to complete the device structure.

A preferred modification of the foregoing three-mask processes for forming encased-gate devices, described as follows, eliminates, during the first etch step of FIG. 13, etching of the silicon layers 142 and 122 to the phantom lines 147 without the necessity of using an etchant that etches layer 128 (of highly-doped N-type silicon) much faster than layers 147 and 142 (of highly-doped P-type and lightly-doped N-type silicon, respectively). This preferred modification comprises providing an oxide layer (not shown) over the exposed upper surface of silicon layers 142 and 122 prior to the step illustrated in FIG. 13 of lateral etching of the conductive gate electrode layer 128. Such oxide layer accordingly masks silicon layers 142 and 122 from an etchant used during the lateral etching of conductive gate electrode layer 128. Such oxide layer may be provided, for example, by thermal oxide growth during the step illustrated in FIG. 11 of diffusing P-type shorting region 124.

If the foregoing modification is used, the step illustrated in FIG. 13 of forming the silicon nitride mask 142 by a nitrogen ion implant would need to be modified by using a higher implant energy so as to implant the nitrogen ions through the oxide layer and into the desired location in the shorting region 124.

While specific embodiments of the invention have been illustrated and described herein, it is realized that numerous modifications and changes will occur to those skilled in the art. It is therefore to be understood that the appended claims are intended to cover all such modifications and changes as fall within the true spirit and scope of the invention.

What is claimed is:

1. A self-aligned process for manufacturing an insulated-gate semiconductor device including an integral short, said process comprising:

providing a semiconductor wafer including a first region of one conductivity type having a principal surface, and preparing the wafer by successively forming on the principal surface at least a gate insulating region layer and a conductive gate electrode layer;

forming on the wafer an etch resist mask having openings defining the ultimate locations of upper electrode regions, and then initially etching in areas defined by the mask openings through the conductive gate electrode layer and the gate insulating region layer to the principal surface;

removing the etch resist mask;

introducing into the first region impurities appropriate to form a shorting region of the opposite conductivity type, with unetched portions of the gate electrode layer serving as a mask during the introduction of shorting region impurities;

forming a mask at the shorting region surface, with the unetched portions of the conductive gate electrode layer serving as a mask during the forming of the mask at the shorting region surface;

laterally etching the previously un-etched portions of the gate electrode layer to define insulated gate electrode structures extending upwardly from and spaced along the principal surface, and spaced from the mask at the shorting region surface;

introducing into the first region between the gate electrodes impurities appropriate to form base regions of opposite conductivity type and impurities appropriate to form upper electrode regions of the one conductivity type within the base region, the gate electrode structures and the mask at the shorting region surface serving as masks during the introduction of impurities, with portions of the upper electrode regions extending laterally under the mask at the shorting region surface, and with the base regions and corresponding shorting region forming a continuous region of the opposite conductivity type below the principal surface, and thermally selectively oxidizing at least the gate electrode sidewalls;

removing the mask at the shorting region surface; and forming a metallized upper electrode region terminal in ohmic contact with the upper electrode and shorting regions, and forming a metallized gate terminal in ohmic contact with the gate electrode.

2. A process in accordance with claim 1, wherein the shorting region impurities, the base region impurities, and the upper electrode region impurities are introduced by gas source diffusion.

3. A process in accordance with claim 2, wherein the mask formed at the shorting region surface comprises silicon nitride and is formed by nitrogen ion implantation and subsequent heating.

4. A process in accordance with claim 2, wherein the mask formed at the shorting region surface comprises silicon nitride and is formed by directional low pressure vapor deposition.

5. A process in accordance with claim 2, wherein the mask formed at the shorting region surface comprises silicon nitride and is formed by directional sputtering of silicon nitride.

6. A process in accordance with claim 1, wherein the mask formed at the shorting region surface comprises silicon nitrode and is formed by nitrogen ion implantation and subsequent heating.

7. A process in accordance with claim 1, wherein the mask formed at the shorting region surface comprises silicon nitride and is formed by directional low pressure vapor deposition.

8. A process in accordance with claim 1, wherein the mask formed at the shorting region surface comprises silicon nitride and is formed by directional sputtering of silicon nitride.

9. A self-aligned process for manufacturing an insulated-gate semiconductor device including an integral short, said process comprising:

providing a semiconductor wafer including a first region of one conductivity type having a principal surface, and preparing the wafer by successively forming on the principal surface at least a gate insulating region layer, and a conductive gate electrode layer, and an upper mask layer;

forming on the upper mask layer an etch resist mask having openings defining the ultimate locations of upper electrode regions, and then initially etching in areas defined by the mask openings through the conductive gate electrode layer and the gate insulating region layer to the principal surface;

removing the etch resist mask;

introducing into the first region impurities appropriate to form a shorting region of the opposite conductivity type, with unetched portions of the gate electrode layer serving as a mask during the introduction of shorting region impurities;

forming a mask at the shorting region surface, with the unetched portions of the conductive gate electrode layer serving as a mask during the forming of the mask at the shorting region surface;

laterally etching the previously un-etched portions of the gate electrode layer to define insulated gate electrode structures extending upwardly from and spaced along the principal surface, and spaced from the mask at the shorting region surface;

introducing into the first region between the gate electrodes impurities appropriate to form base regions of opposite conductivity type and impurities appropriate to form upper electrode regions of the one conductivity type within the base region, the gate electrode structures and the mask at the shorting region surface serving as masks during the introduction of impurities, with portions of the upper electrode regions extending laterally under the mask at the shorting region surface, and with the base regions and corresponding shorting region forming a continuous region of the opposite conductivity type below the principal surface, and thermally selectively oxidizing at least the gate electrode sidewalls, oxidation of the gate electrode top being masked by the remaining portions of the upper mask layer;

removing the mask at the shorting region surface; and depositing metal onto the wafer surface to form conductive gate layer terminals in electrical contact with the gate electrodes, and to form metallized recessed upper electrode terminals in ohmic contact with the upper electrode region and with the shorting region.

10. A process in accordance with claim 9, wherein the shorting region impurities, the base region impurities, and the upper electrode region impurities are introduced by gas source diffusion.

11. A process in accordance with claim 10, wherein the mask formed at the shorting region surface comprises silicon nitride and is formed by directional low pressure vapor deposition.

12. A process in accordance with claim 10, wherein the mask formed at the shorting region surfaces comprises silicon nitride and is formed by directional sputtering of silicon nitride.

13. A process in accordance with claim 9, wherein the mask formed at the shorting region surface comprises silicon nitride and is formed by directional low pressure vapor deposition.

14. A process in accordance with claim 9, wherein the mask formed at the shorting region surface comprises silicon nitride and is formed by directional sputtering of silicon nitride.

15. A self-aligned process for manufacturing an insulated-gate semiconductor device including an integral short, said process comprising:

providing a silicon semiconductor wafer including a first region of one conductivity type having a principal surface, and preparing the wafer by successively forming on the principal surface a gate insulating region layer, a conductive gate electrode layer of high-doped polysilicon, a silicon dioxide upper layer, and a silicon nitride upper layer;

forming on the silicon nitride upper layer a first etch resist mask having openings defining the ultimate locations of upper electrode regions, and then initially etching in areas defined by the mask openings through the upper layers, the polysilicon conductive gate electrode layer, and the gate insulating region layer to the principal surface;

removing the etch resist mask;

introducing into the first region impurities appropriate to form a shorting region of the opposite conductivity type, with unetched portions of the polysilicon conductive gate electrode layer serving as masks during the introduction of shorting region impurities;

forming a silicon nitride mask at the shorting region surface, with the unetched portions of the polysilicon gate electrode layer serving as a mask during the forming of the silicon nitride mask;

laterally etching the previously un-etched portions of the polysilicon gate electrode layer to define insulated polysilicon gate electrode structures extending upwardly from and spaced along the principal surface, and spaced from the silicon nitride masks at the shorting region surfaces;

introducing into the first region between the polysilicon gate electrodes impurities appropriate to form base regions of opposite conductivity type and impurities appropriate to form upper electrode regions of the one conductivity type within the base regions, the polysilicon gate electrode structures and the silicon nitride mask at the shorting region surface serving as masks during the introduction of impurities, with portions of the source regions extending laterally under the silicon nitride masks at the shorting region surfaces, and with the base regions and corresponding shorting regions forming a continuous region of the opposite conductivity type below the principal surface, and thermally selectively oxidizing at least the gate electrode sidewalls;

selectively etching to remove the silicon nitride upper layer and the silicon nitride mask at the shorting region surface to expose bare silicon at the principal surface on the shorting regions and on the source region portions which extended laterally under the silicon nitride masks;

providing a second mask with windows for defining at least one gate contact on a portion of the wafer other than the location of the source regions, etching through the silicon dioxide upper layer to form an opening to the gate electrode layer in the window defined by the second mask, and removing the second mask; and coating metal onto the wafer and then patterning the metal by means of a third mask to form source and gate electrode layers.

16. A process in accordance with claim 15, wherein the shorting region impurities, the base region impurities, and the source region impurities are introduced by gas source diffusion.

17. A process in accordance with claim 16, wherein the silicon nitride mask is formed at the shorting region surface by nitrogen ion implantation and subsequent heating.

18. A process in accordance with claim 16, wherein the silicon nitride masks are formed at the shorting region surfaces by directional low pressure vapor deposition.

19. A process in accordance with claim 16, wherein the silicon nitride masks are formed at the shorting region surfaces by directional sputtering of silicon nitride.

20. A process in accordance with claim 15, wherein the silicon nitride mask is formed at the shorting region surface by nitrogen ion implantation and subsequent heating.

21. A process in accordance with claim 15, wherein the silicon nitride masks are formed at the shorting region surfaces by directional low pressure vapor deposition.

22. A process in accordance with claim 15, wherein the silicon nitride masks are formed at the shorting region surfaces by directional sputtering of silicon nitride.

* * * * *